(12) United States Patent
Ogura et al.

(10) Patent No.: US 8,530,979 B2
(45) Date of Patent: Sep. 10, 2013

(54) SEMICONDUCTOR PACKAGE AND METHOD FOR MANUFACTURING THE SAME

(75) Inventors: Shingo Ogura, Sakura (JP); Yuki Suto, Sakura (JP)

(73) Assignee: Fujikura Ltd., Tokyo (JP)

( * ) Notice: Subject to any disclaimer, the term of this patent is extended or adjusted under 35 U.S.C. 154(b) by 157 days.

(21) Appl. No.: 12/896,500

(22) Filed: Oct. 1, 2010

(65) Prior Publication Data
US 2011/0018112 A1 Jan. 27, 2011

Related U.S. Application Data

(63) Continuation of application No. PCT/JP2009/056956, filed on Apr. 3, 2009.

(30) Foreign Application Priority Data

Apr. 4, 2008 (JP) .................................. 2008-098770

(51) Int. Cl.
*H01L 21/02* (2006.01)
(52) U.S. Cl.
USPC ........... 257/411; 257/418; 257/162; 257/260; 438/125; 438/322; 438/380; 438/419; 438/535; 365/103; 365/114; 365/115; 365/163; 365/181; 327/260; 327/565
(58) Field of Classification Search
USPC .................. 257/411, 418, 162, 260, 263, 265, 257/272, 273, 296; 438/125, 322, 380, 419, 438/535, 542; 365/103, 114, 115, 163, 181; 327/260, 565
See application file for complete search history.

(56) References Cited

U.S. PATENT DOCUMENTS

| 7,932,594 | B2 * | 4/2011 | Maeda et al. ................. 257/693 |
| 2001/0020738 | A1 | 9/2001 | Iizima et al. |
| 2003/0116825 | A1 | 6/2003 | Geefay et al. |

(Continued)

FOREIGN PATENT DOCUMENTS

| JP | 2001-257334 A | 9/2001 |
| JP | 2002118193 A * | 4/2002 |

(Continued)

OTHER PUBLICATIONS

First Office Action dated Oct. 10, 2011 issued by the State Intellectual Property Office of People's Republic of China in counterpart Chinese Patent Application No. 200980112204.1

(Continued)

*Primary Examiner* — Telly Green
(74) *Attorney, Agent, or Firm* — Sughrue Mion, PLLC (57) ABSTRACT

Provided is a semiconductor package which includes: a semiconductor substrate; a functional element that is disposed on one surface of the semiconductor substrate; a protection substrate that is disposed in an opposite side of that surface of the semiconductor substrate with a predetermined gap from a surface of the semiconductor substrate; and a junction member that is disposed to surround the functional element and bonds the semiconductor substrate and the protection substrate together, wherein the functional element has a shape different from a shape of a plane surrounded by the junction member in that surface of the semiconductor substrate, or is disposed in a region deviated from a central region of the plane surrounded by the junction member in that surface of the semiconductor substrate.

6 Claims, 9 Drawing Sheets

(56) References Cited

U.S. PATENT DOCUMENTS

| | | |
|---|---|---|
| 2005/0247992 A1 | 11/2005 | Tsukamoto et al. |
| 2006/0043544 A1 | 3/2006 | Tsukamoto et al. |
| 2009/0091018 A1* | 4/2009 | Maeda et al. ............ 257/693 |

FOREIGN PATENT DOCUMENTS

| | | |
|---|---|---|
| JP | 2002118193 A | 4/2002 |
| JP | 2002-231919 A | 8/2002 |
| JP | 2003-092394 A | 3/2003 |
| JP | 2003-204005 A | 7/2003 |
| JP | 2005-322809 A | 11/2005 |
| JP | 2006-073546 A | 3/2006 |
| JP | 2008-112835 A | 5/2008 |
| WO | 2009/090895 A1 | 7/2009 |

OTHER PUBLICATIONS

Japanese Office Action for Japanese Application No. 2010-505995 dated Jul. 30, 2013.

* cited by examiner

RELATION BETWEEN RESIN WIDTH RATIO AND STRESS RATIO

SEMICONDUCTOR PACKAGE AND METHOD FOR MANUFACTURING THE SAME

CROSS-REFERENCE TO RELATED APPLICATION

This is a Continuation Application of International Application No. PCT/JP2009/056956, filed on Apr. 3, 2009, which claims priority to Japanese Patent Application No. 2008-098770, filed on Apr. 4, 2008. The contents of the aforementioned applications are incorporated herein by reference.

BACKGROUND OF THE INVENTION

Apparatuses and embodiments described herein relate to a semiconductor package having a hollow structure, and a method for manufacturing the same.

As a method for package of semiconductor devices, although mold-typed packages have been conventionally used, chip size packages (CSPs) have recently attracted attention according to requirements for reduction of package size from markets. Among other things, when CSP is applied to a MEMS device requiring a hollow structure on a surface of a functional device represented by an optical device, a method of bonding a device substrate to a protection substrate made of glass or the like via a junction layer having a hollow pattern formed thereon is used. After bonding the protection substrate, the hollow pattern becomes a hollow structure.

Since there is a need to form a hollow structure on a photosensitive portion in an optical device, the hollow pattern is formed on the junction layer in such a manner that the hollow pattern exposes the photosensitive portion. In other MEMS devices, a hollow pattern is formed on a sensing portion and an operating portion. The material of the junction layer may be optional without being limited to organic material and inorganic material. In particular, in many cases, an optical device employs a junction layer made of resin from restrictions such as an upper limit of process temperature due to heat resistance of a photosensitive portion made of resin.

In addition, a method of forming the hollow pattern may include a dispense method, a print method and so on, which are simple and inexpensive. However, a photolithography for photosensitive resin material is the mainstream in semiconductor industries which have made noticeable progress in miniaturization of device surface machining.

Acryl is representative of resin material to which photolithography can be applied and which has adhesive properties as a junction layer. In addition, even for a material having adhesiveness but no photosensitivity, by mixing a photosensitive ingredient in the material, it is possible to obtain a junction material to which photolithography can be applied. Many proposals have been made to use epoxy, silicon, phenol, polyimide or a mixture thereof as such a resin material.

Exhibition of adhesion of such a resin material requires a thermosetting reaction by thermocompression of the subject substrate and the resin material, which is performed after patterning the resin material. Main parameters for the thermocompression are an atmosphere pressure, a compression pressure, a compression temperature, etc. in bonding.

Two qualities are required after the hollow package is formed using the resin material. The first quality is package reliability (adhesion). In order to secure this quality, there is a need of thermocompression conditions to draw out an inherent adhesive strength of the junction layer material sufficiently. In addition, there is a need to prevent a loss of adhesion area caused by mixture of foams into an adhesive interface.

In order to draw out the inherent adhesive strength of the junction layer material sufficiently, there is a need to press the adhesive material against the subject substrate at an initial stage of adhesion such that the adhesive material approaches the subject substrate by a distance sufficient to exhibit chemical adhesion strength. As a process condition in doing so, there is a need to increase both a compression pressure and a compression temperature on the whole. In order to eliminate the mixture of foams into the adhesive interface, which has an effect on both reliability and appearance quality, there is a need to decrease an atmosphere pressure in boding as well as the high compression pressure and high compression temperature.

The second quality is a package appearance quality. Specifically, it is required that foams should not be mixed into the adhesive interface and a junction layer pattern after thermocompression should be little different in width from a junction layer pattern before thermocompression (that is, their dimension remains unchanged).

The main reason for dimension change is plastic deformation of the junction layer material in thermocompression and rheological deformation produced beyond a softening point. If the degree of deformation is too large, it has an effect on the appearance quality and also results in permeation of the junction layer material up to a surface of a photosensitive region in an optical sensor, thereby causing the characteristic failure of a device. Since a process condition where deformation is apt to occur is that both a compression pressure and a compression temperature are substantially high, a low compression pressure and a low compression temperature are required to suppress the deformation.

In this manner, since the reliability and the appearance quality of the hollow package are diametrically opposed in terms of the thermocompression conditions required to secure the reliability and the appearance quality, there is a need to adjust the thermocompression conditions for compatibility of the reliability with the appearance quality.

In view of such a compatibility problem, there has been proposed a structure where a bank is provided between a light receiving portion of a solid-state imaging device and an adhesive resin in order to prevent the adhesive resin from penetrating into the light receiving portion (refer to Patent Document 1 below). Although this proposal facilitates the adaptation of a process of high compression pressure and high compression temperature since the bank functions to prevent the adhesive resin from being introduced into the light receiving portion, this proposal does not disclose a solution related to maintenance of pattern dimension.

Figure 11:
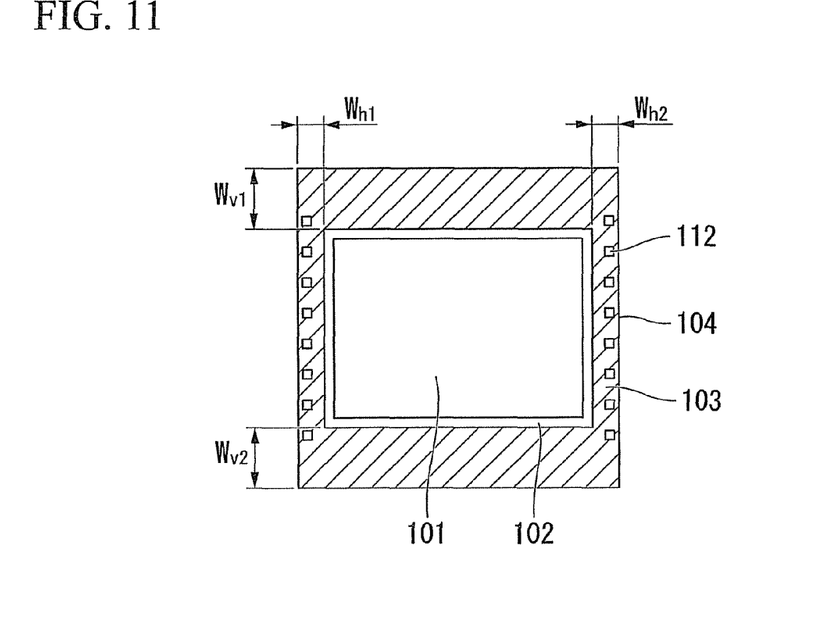
FIG. 11 is a schematic plan view illustrating an example of a convention optical device chip.

In the related art, one of the reasons for difficulty in compatibility of reliability with appearance quality may include a relationship between position and dimension of a hollow pattern of a device chip. FIG. 11 is a schematic plan view showing a conventional optical device chip. In this figure, reference numeral 101 denotes a photosensitive region, reference numeral 102 denotes a hollow region, reference numeral 103 denotes an adhesive region, reference numeral 104 denotes an optical device chip and reference numeral 112 denotes an electrode pad on the optical device chip. The electrode pad is provided to make an electrical connection of the optical device chip to an external circuit using fine metal lines, through wires or the like. Although not shown, fine surface wires are formed between the photosensitive region and the electrode pad in an actual optical device chip, and in addition, a plurality of functional elements is interposed between the wires.

In FIG. 11, the aspect ratio of the photosensitive region is different from that of the device chip but has the same center coordinate as the device chip. In FIG. 11, $Wh_1$, $Wh_2$, $Wv_1$ and $Wv_2$ denote widths of the adhesive region, that is, widths in the left, right, upper and lower sides, respectively, of the hollow region in FIG. 11.

The conventional mainstream design for a hollow package is to provide a hollow region distant by equal intervals from the photosensitive region. As shown in FIG. 11, if the design is made as conventional when the photosensitive region is different in aspect ratio from the device chip, a difference occurs between four sides of the adhesive region. In FIG. 11, $Wh_1 = Wh_2 < Wv_1 = Wv_2$.

Figure 12:
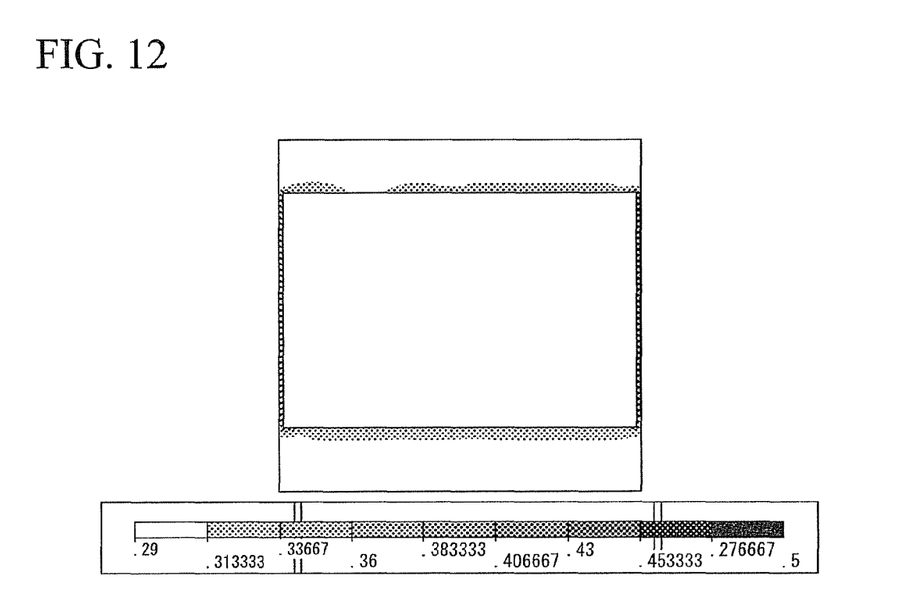
FIG. 12 is a view illustrating a distribution of stress applied to an adhesive layer when a subject substrate is pressed.

FIG. 12 illustrates a distribution of stress applied to an junction layer, which is drawn according to finite element analysis, when a subject substrate having the same size as the device chip is pressed against the device chip where $Wh_1 = Wh_2 < Wv_1 = Wv_2$ as in FIG. 11. A level bar provided in the lower side of FIG. 12 indicates a "stress value" meaning that stress increases from the left side (indicated in blue color in original figure) to the right side (indicated in red color in original figure).

In FIG. 12, it is apparent that more stress is applied to the narrower horizontal adhesion width ($Wh_1$ and $Wh_2$) than the wider vertical adhesion width ($Wv_1$ and $Wv_2$). In other words, when the subject substrate is pressed with a certain load against the entire surface of the junction layer having the different size, nonuniformity of local stress occurs due to differences in their widths. As a result, plastic deformation of junction material is likely to occur due to overstress in the region having narrower adhesion width, while junction failure such as a foam mixture is likely to occur due to low stress in the region having wider adhesion width.

Figure 13:
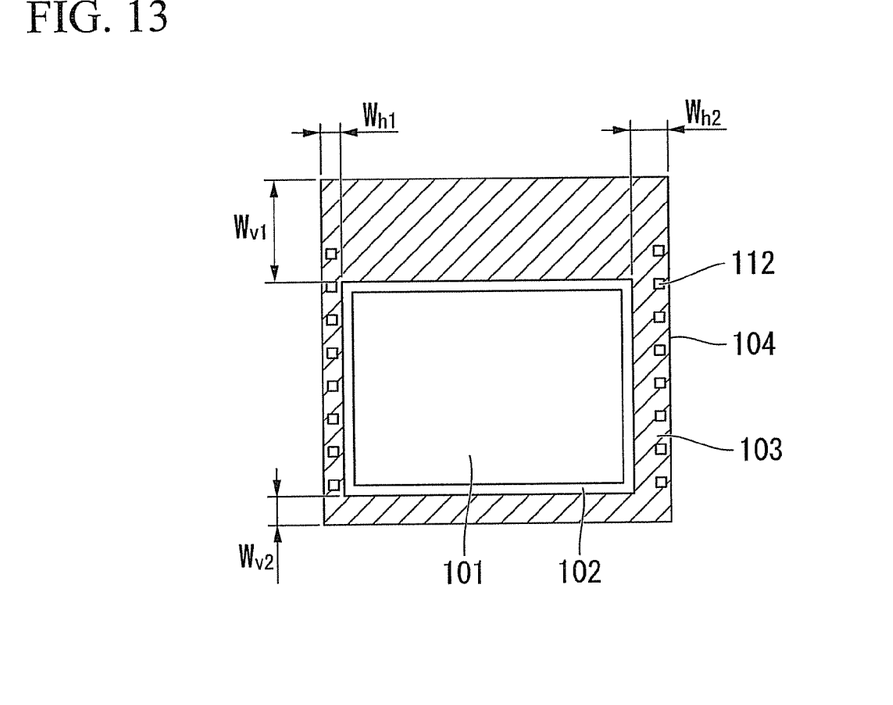
FIG. 13 is a schematic plan view illustrating another example of the conventional optical device chip.

FIG. 13 is a schematic plan view of another optical device chip. FIG. 13 is characterized in that the photosensitive region is different in aspect ratio and center coordinate from the device chip. Accordingly, the relationship between their adhesion widths is $Wh_1 \neq Wh_2 \neq Wv_1 \neq Wv_2$. Since an actual device chip is designed in consideration of arrangement of structures other than the photosensitive region, it is common that the center coordinate of the photosensitive region is deviated from that of the device chip, as shown in FIG. 13. When a hollow region for such a device chip is formed distant by a distance of equal intervals from the photosensitive region, as conventional, it can be envisaged that a distribution of stress in thermal pressing is more deteriorated than in the case shown in FIG. 12 (that is, more significant nonuniform local stress is produced).

[Patent Document 1] Japanese Unexamined Patent Application, First Publication No. 2003-92394

In consideration of the above circumstances, it is an aspect of exemplary embodiments of the present invention to provide a semiconductor package with a hollow structure, which makes junction reliability compatible with dimension maintenance by uniformizing an in-plane stress applied when a semiconductor substrate is bonded to a protection substrate by thermocompression.

It is another aspect of exemplary embodiments of the present invention to provide a method of manufacturing a semiconductor package with a hollow structure, which is capable of uniformizing an in-plane stress applied when a semiconductor substrate is bonded to a protection substrate by thermocompression, thereby easily obtaining a semiconductor package with compatibility of junction reliability with dimension maintenance.

SUMMARY OF THE INVENTION

In order to overcome the above problems and accomplish the above objects, aspects of exemplary embodiments of the present invention provides the following means:

(1) A first aspect of a semiconductor package according to the present invention includes: a semiconductor substrate; a functional element that is disposed on one surface of the semiconductor substrate; a protection substrate that is disposed in the opposite side of the one surface of the semiconductor substrate with a predetermined gap from a surface of the semiconductor substrate; and a junction member that is disposed to surround the functional element and bonds the semiconductor substrate and the protection substrate together, wherein the functional element has a shape different from that of a plane surrounded by the junction member in that surface of the semiconductor substrate, or is disposed in a region deviated from a central region of the plane surrounded by the junction member in that surface of the semiconductor substrate.

(2) In the semiconductor package according to (1) above, a plurality of functional elements may be disposed on the one surface of the semiconductor substrate and the junction member may be disposed to surround the plurality of functional elements.

(3) In the semiconductor package according to (1) or (2) above, a is a minimum width of the junction member and b is a maximum width of the junction member, and b/a may be in a range of 1 to 19.

(4) In the semiconductor package according to (3) above, the circumference of the junction member may lie on substantially the same plane as an outer end surface of the protection substrate or an outer end surface of the semiconductor substrate.

(5) A method of manufacturing a first aspect of a semiconductor package including a semiconductor substrate; a functional element that is disposed on one surface of the semiconductor substrate; a protection substrate that is disposed in an opposite side of the one surface of the semiconductor substrate with a predetermined gap from a surface of the semiconductor substrate; and a junction member that is disposed to surround the functional element and bonds the semiconductor substrate and the protection substrate together, wherein the functional element has a shape different from that of a plane surrounded by the junction member in the one surface of the semiconductor substrate or is disposed in a region deviated from a central region of the plane surrounded by the junction member in the surface of the semiconductor substrate, the method includes: disposing a lattice-shaped junction member on a semiconductor substrate having at least one functional element formed thereon, such that the junction member surrounds the functional element; bonding the semiconductor substrate and the protection substrate together via the junction member; and segmentalizing the semiconductor substrate such that the junction member is disposed in a circumferential region.

(6) In the method of manufacturing a semiconductor package according to (5) above, a is a minimum width of the junction member and b is a maximum width of the junction member, and b/a may be in a range of 1 to 19.

According to an aspect of the semiconductor package, the functional element has a shape different from a shape of a plane surrounded by a junction member in one surface of the semiconductor substrate, or is disposed in a region deviated from the central region of the plane surrounded by the junction member in that surface of the semiconductor substrate. As a result, pressure irregularity in a plane when the semiconductor substrate and the protection substrate are bonded together by thermocompression can be reduced. In addition, junction failure caused by a foam mixture can be suppressed. Thus, the semiconductor package can have compatibility of junction reliability with package dimension.

According to the method of manufacturing an aspect of the semiconductor package, by disposing the lattice-shaped junction member on the semiconductor substrate having at least one functional element formed thereon, such that the junction member surrounds the functional element, and bonding the semiconductor substrate and the protection substrate together via the junction member. As a result, it is possible to reduce in-plane pressure irregularity when the semiconductor substrate is bonded to the protection substrate by thermocompression. In addition, it is possible to suppress junction failure caused by a foam mixture. Thereafter, by segmentalizing the semiconductor substrate such that the junction member is disposed in the circumferential region, it is possible to easily attain a semiconductor package with compatibility of junction reliability with dimension maintenance.

DESCRIPTION OF EXEMPLARY EMBODIMENTS

Best exemplary embodiments for achieving a semiconductor package of the present invention will be described. The following exemplary embodiments are provided for the purpose of better understanding of the idea of the present invention, and the present invention is not limited to the disclosed exemplary embodiments unless otherwise stated.

First Exemplary Embodiment

Figure 1A:
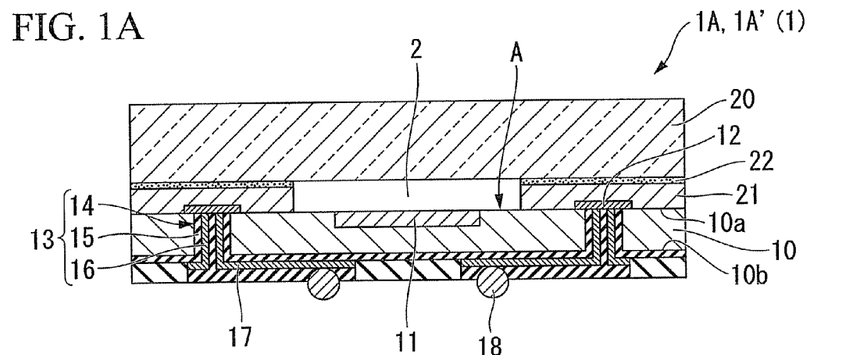
FIG. 1A is a schematic sectional view showing a semiconductor package according to an exemplary embodiment of the present invention.
Figure 1B:
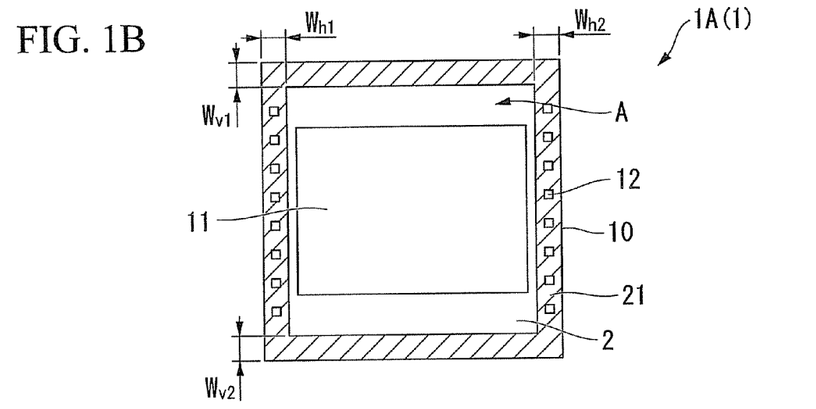
FIG. 1B is a plan view of the semiconductor package.
Figure 1C:
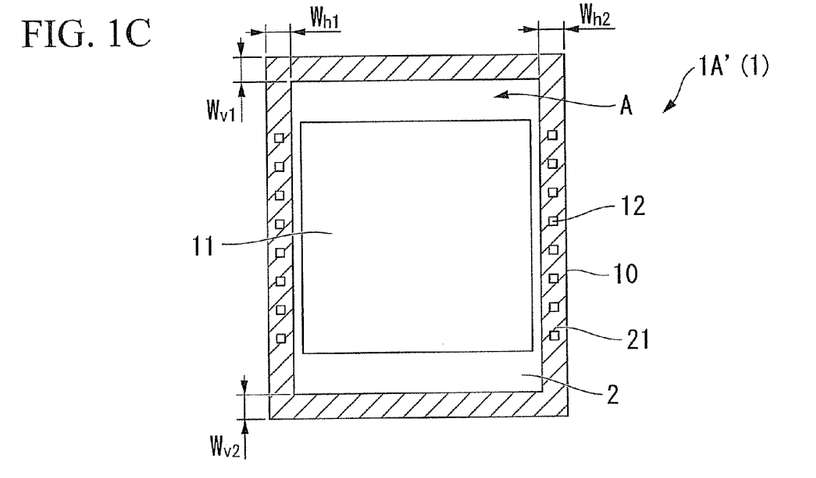
FIG. 1C is a plan view of the semiconductor package.

FIGS. 1A to 1C are views illustrating a semiconductor package according to a first exemplary embodiment of the present invention, FIG. 1A being a sectional view and FIGS. 1B and 1C being schematic plan views illustrating a position relationship between a functional element and a junction member in the semiconductor package. FIGS. 1B and 1C show semiconductor chips which have a square shape and a rectangular shape, respectively, when viewed from top.

The semiconductor package 1A, 1A' (1) includes at least a semiconductor substrate 10, a functional element 11 disposed on one surface of the semiconductor substrate 10, a protection substrate 20 disposed in the opposite side of the one surface of the semiconductor substrate 10 with a predetermined gap from a surface of the semiconductor substrate 10, and a junction member 21 which is disposed to surround the functional element 11 and bonds the semiconductor substrate 10 and the protection substrate 20 together.

In the semiconductor package 1 of the present invention, the functional element 11 has a shape different from a shape of a plane A surrounded by the junction member 21 in the one surface of the semiconductor substrate 10, or is disposed in a region deviated from the central region of the plane A surrounded by the junction member 21 in the one surface of the semiconductor substrate 10.

Figure 14:
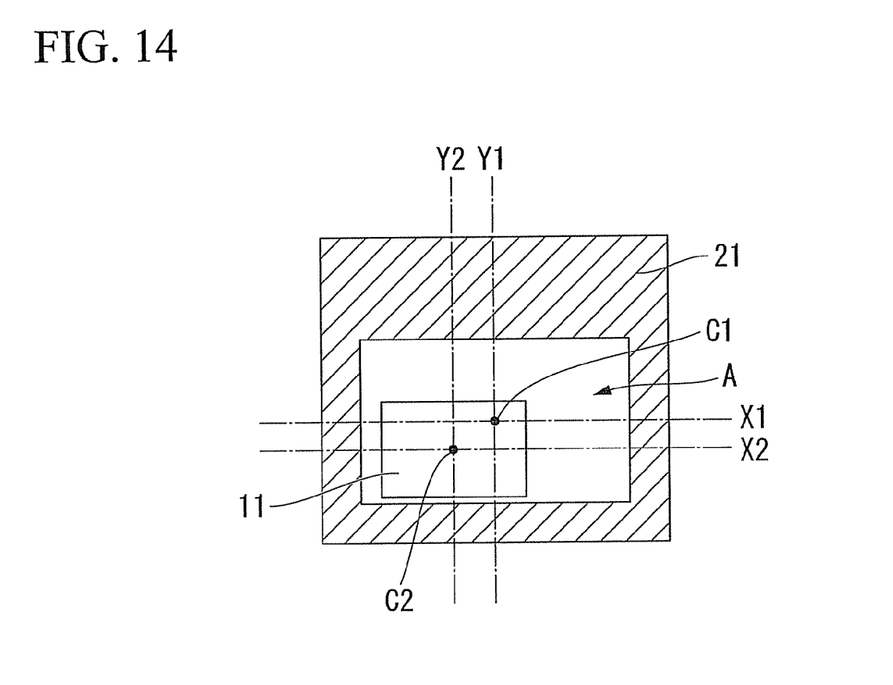
FIG. 14 is a schematic plan view illustrating a functional element which is disposed in a region deviated from a central region of the plane surrounded by the junction member.

In addition, FIG. 14 is a schematic plan view illustrating a functional element which is disposed in a region deviated from a central region of the plane surrounded by the junction member. FIG. 14 shows one example where both the junction member 21 and the functional element 11 have a rectangular shape when viewed from the top.

As shown in FIG. 14, an intersection point of a perpendicular bisector X1 and a perpendicular bisector Y1 which are drawn to each side of the plane A surrounded by the junction member 21 corresponds to a center C1 of the plane A surrounded by the junction member 21. The center C1 is a central region of the plane A surrounded by the junction member 21. That is, a region deviated from a central region of the plane A surrounded by the junction member 21 represents a region except for the center C1 of the plane A surrounded by the junction member 21. On the other hand, an intersection point of a perpendicular bisector X2 and a perpendicular bisector Y2 which are drawn to each side of the functional element 11 corresponds to a center C2 of the functional element 11.

That is, a functional element 11 which is disposed in a region deviated from a central region of the plane surrounded by the junction member is disposed such that the center C2 of the functional element 11 locates in a region except for the center C1 (central region) of the plane A surrounded by the junction member 21.

In addition, the shape of the functional element is not limited as long as it is possible to determine a center when viewed from the top. For example, it may be used a square, an oval, a circle, a square which has a chamfered corner or the like. In this manner, the shape of the plane surrounded by the junction member is not limited as long as it is possible to determine a center when viewed from the top. For example, it may be used a square, a square which has a chamfered corner or the like.

In the present invention, the functional element 11 has a shape different from that of a plane A surrounded by the junction member 21 in one surface of the semiconductor substrate 10, or is disposed in a region deviated from the central region of the plane A surrounded by the junction member 21 in the one surface of the semiconductor substrate 10. As a result, pressure irregularity in a plane when the semiconductor substrate 10 and the protection substrate 20 are bonded together by thermocompression can be reduced. In addition, junction failure caused by a foam mixture can be suppressed. Thus, the semiconductor package 1 can have compatibility of junction reliability with package dimension.

The semiconductor substrate 10 is made of, for example, silicon or the like. The semiconductor substrate 10 has the functional element 11 and an electrode pad 12 which are formed on one surface 10a, as well as a through electrode 13 for electrically interconnecting the other surface 10b with the electrode pad 12. The through electrode 13 is formed by filling a minute hole 14 penetrating through both front and rear surfaces of the semiconductor substrate 10 with a conductor 16 via an insulating film 15. In addition, a bump 18 for external connection is disposed in a wiring portion 17 electrically connected to the through electrode 13.

In this exemplary embodiment, the functional element 11 may be, for example, an image sensor such as a CCD element. In this manner, if the functional element 11 is an optical device, it is preferable that the functional element 11 has optical transparency in a used band of wavelength of the functional element 11. In this case, the protection substrate 20 which is made of glass, optically transparent resin or the like, may be used. In addition, the protection substrate 20 may have optical functions such as various optical filter functions, lens functions and the like.

If a MEMS (MEMS=Micro Electro Mechanical System) device or the like as another example of the functional element 11 is packaged at a wafer level, the present invention may also be applied to a package requiring a cavity around the MEMS device due to the existence of a movable portion or the like. Examples of the MEMS device which can be packaged may include a micro relay, a micro switch, a pressure sensor, an acceleration sensor, a high frequency filter, a micro mirror or the like.

The electrode pad 12 and the wiring portion 17 may be suitably made of material with good conductivity, such as aluminum (Al), copper (Cu), aluminum-silicon (Al—Si) alloy, aluminum-silicon-copper (Al—Si—Cu) alloy or the like, but such a material is easily oxidizable.

The insulating film 15 may be made of silicon oxide ($SiO_2$), silicon nitride ($Si_3N_4$), phosphor silicate glass (PSG), borophosphosilicate glass (BPSG) or the like which may be selected depending on use environments of the semiconductor package 1.

The conductor 16 is not particularly limited as long as it has good conductivity, and may be made of, for example, metal such as an alloy of Au—Sn, Sn—Pb or the like, a solder alloy of an Sn group, a Pb group, a Au group, an In group or the like in addition to copper, aluminum, nickel, chrome, silver, tin or the like having low electrical resistance.

The protection substrate 20 is disposed above the functional element 11 with a gap therebetween and serves to protect the functional element 11. The protection substrate 20 may be made of a sheet material such as resin, glass, metal or the like.

The junction member 21 serves to secure a gap between the semiconductor substrate 10 and the protection substrate 20 and bond the protection substrate 20 and the semiconductor substrate 10 together. The junction member 21 is provided at a predetermined position at which the junction member 21 surrounds the functional element 11 seamlessly and completely covers a plurality of electrode pads 12 arrayed on the semiconductor substrate surface 10a without covering the functional element 11 contacting the semiconductor substrate surface 10a when the protection substrate 20 is bonded to the semiconductor substrate 10. With this configuration, a space (hollow portion 2) adjacent to the functional element 11 is hermetically sealed by the semiconductor substrate 10, the protection substrate 20 and the junction member 21. Further, a surface of the electrode pad 12 is physically covered and protected to improve its mechanical strength.

The junction member 21 is not particularly limited but may be made of, for example, a resin material such as acryl, silicon, phenol, polyimide or the like.

Height (thickness) of the junction member 21 is not particularly limited but may be optional depending on conditions such as a specification required by the functional element 11. For example, if the height (thickness) of the junction member 21 is in a range of several µm to several hundred µm, it is possible to secure a sufficient cavity around the functional element 11 and restrict the overall size of the semiconductor package 1.

As will be described in detail later, particularly, in the semiconductor package 1 of the present invention, in a relationship between the junction member 21 and the functional element 11, the functional element 11 has a shape different from a shape of a plane A surrounded by the junction member 21 in one surface of the semiconductor substrate 10, or is disposed in a region deviated from the central region of the plane A surrounded by the junction member 21 in the one surface of the semiconductor substrate 10. Thus, the semiconductor package 1 can have compatibility of junction reliability with package dimension.

In addition, assuming that the minimum width of the junction member 21 is a and its maximum width is b, it is preferable that b/a is in a range of 1 to 19. With this range, it is possible to restrict the change of dimension of the hollow portion after thermocompression of the semiconductor substrate 10 and the protection substrate 20 to be less.

In addition, it is preferable that the circumference of the junction member 21 lies on substantially the same plane as an outer end surface of the protection substrate 20 or an outer end surface of the semiconductor substrate 10.

The junction member 21 can be formed at a desired position by, for example, applying liquid resin on a predetermined position using a print method, or patterning a laminated dry film, with only a predetermined position left, using a photolithography technique.

An adhesive used for the adhesive layer 22 may be, for example, an epoxy resin, a photosensitive BCB resin or the like. The adhesive layer 22 can be formed by applying the adhesive on a surface of the protection substrate 20. A method of applying the adhesive is not particularly limited but may use, for example, a stamping method, a dispense method, a spin coat method, a spray coat method or the like. The thickness of the adhesive layer 22 is set to be thick so as to obtain a sufficient adhesive strength according to the type of adhesive material.

Next, arrangement of the junction member 21 and width of the junction member 21, which are critical points of the present invention, will be described.

In order to solve both the change of dimension in the hollow portion and adhesion failure caused by nonuniformity of width of the junction member 21, that is, nonuniformity of width of an adhesive region, only the nonuniformity of the adhesive region width, which is the cause of such a change of dimension and the adhesion failure, may have to be alleviated. To do so, there is a need to change the conventional design method of providing a hollow region with a distance of equal intervals from a photosensitive region.

Figure 8:
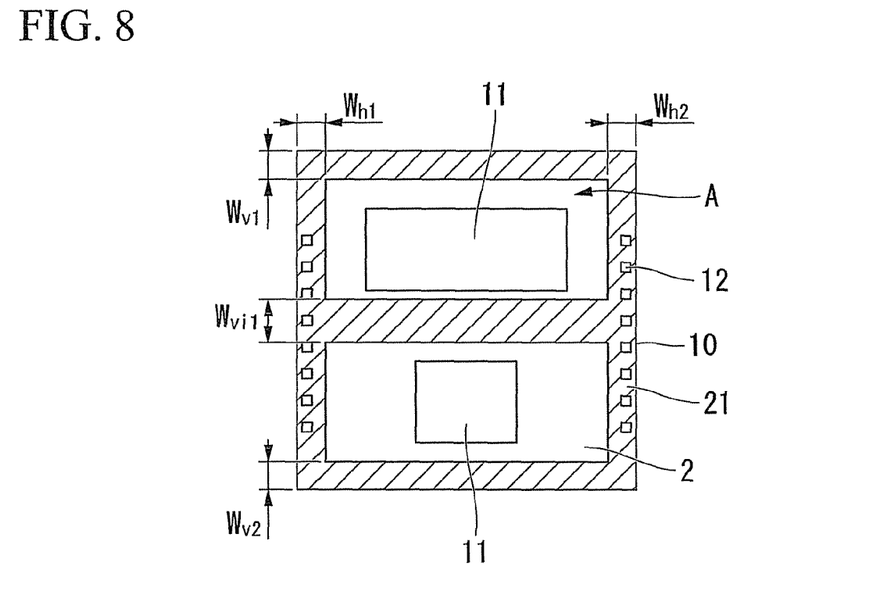
FIG. 8 is a schematic plan view illustrating a semiconductor package according to another exemplary embodiment of the present invention.

FIG. 1B is a schematic plan view showing a position relationship between the functional element 11 and the junction member 21 in the semiconductor package 1A (1), which shows one example applied to a semiconductor chip which has a square shape when viewed from the top and modifies width of an adhesive region shown in FIG. 8. Specifically, four sides of the junction member 21 have the same width. That is, in FIG. 1B, $Wh_1=Wh_2=Wv_1=Wv_2$.

Figure 2:
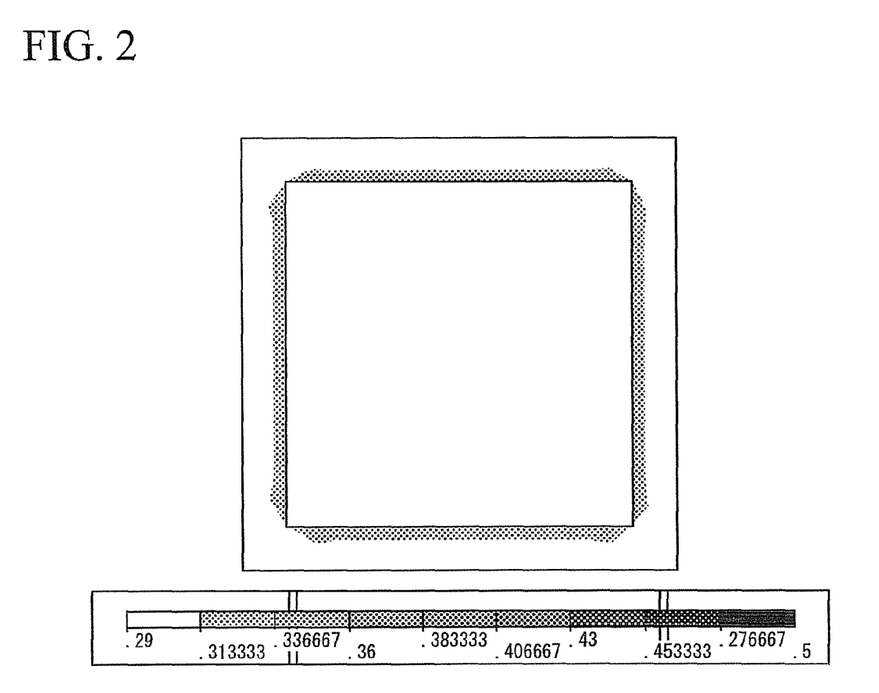
FIG. 2 is a view illustrating a distribution of stress applied to a junction layer when a protection substrate is pressed in the semiconductor package.

FIG. 2 shows a distribution of weight drawn according to a finite element analysis when an adhesive substrate having the same size as the semiconductor chip having the junction member designed as above is pressed against the semiconductor chip. From comparison of FIG. 2 with FIG. 9, it is apparent that a distribution of compression load applied to the four sides of the adhesive region is uniform in FIG. 2. As can be clearly seen from this figure, the use of the design method according to the present invention makes it possible to reduce nonuniformity of the compression load distribution in the adhesive region and hence overcome the above-mentioned problem.

In the semiconductor package 1 having the hollow structure to which the present invention is applied, the adhesive region naturally becomes narrow, that is, speaking extremely, the junction member 21 coats and protects only the vicinity of the circumference of the semiconductor substrate 10. However, since a surface of the semiconductor substrate 10 is coated with and protected by a so-called passivation film, the surface essentially requires no coat and protection by the junction member 21.

As a place where the passivation film is exceptionally removed, there may be the electrode pad 12 (I/O pad) provided for the purpose of securing an electrical conduction with an external circuit by fusion with a fine metal line. In addition, it is preferable that the electrode pad 12 is covered and protected by the junction member 21 from a standpoint of prevention of wet rot. Although a plurality of electrode pads 12 exists on the semiconductor substrate, since it is required to avoid circuit-short between metal copper lines electrically connected to an external circuit, it is common that the electrode pads 12 are arranged in the circumferential region of the semiconductor substrate 10. Accordingly, even when the present invention is applied, the coat and protection of the electrode pad 12 arranged in the circumference of the semiconductor substrate surface 10a is sufficiently possible and accordingly no problem related to a package structure occur.

In addition, it can be said in other words that the minimum width of the adhesive region in the present invention may only have to be slightly greater than the width of the electrode pad. In addition, a through wiring formation process of via-last requires coat and protection of the electrode pads.

Figure 3:
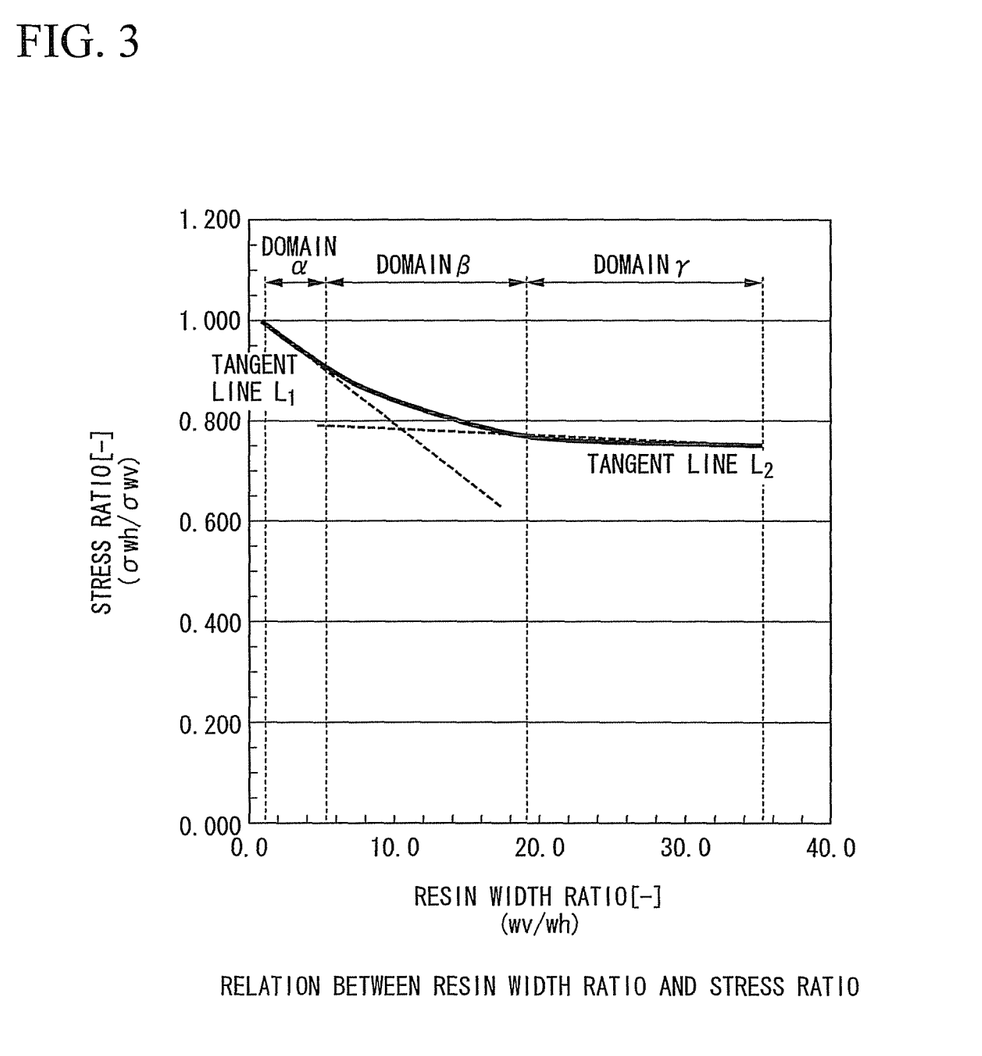
FIG. 3 is a view illustrating a relationship between a ratio of width of a junction member and a ratio of stress.

In the present invention, the extent of stress distribution with respect to the ratio of the width of the junction member 21 is questionable in actuality. FIG. 3 is a view illustrating a relationship between a ratio of the width of the junction member 21 and a ratio of stress.

Like FIGS. 1A to 1C, this figure shows a result of a finite element analysis performed for a model of varying a ratio of Wh and Wv with a chip size fixed for a chip having a relation of $Wh_1=Wh_2<Wv_1=Wv_2$. A horizontal axis represents a resin width ratio (Wv/Wh) and a vertical axis represents a stress ratio ($\sigma_{Wh}/\sigma_{Wv}$). Here, the stress ratio ($\sigma_{Wh}/\sigma_{Wv}$) refers to a ratio of a stress value $\sigma_{Wh}$ applied to Wh to a stress value $\sigma_{Wv}$ applied to Wv.

In addition, FIG. 1C shows one example applied to a semiconductor chip which has a rectangular shape when viewed from the top, and the above-described exemplary embodiment of the present invention shows the same effect for such a rectangular semiconductor chip.

As apparent from FIG. 3, the stress ratio has a tendency to decrease with an increase of the resin width ratio. This tendency of decrease is classified into three domains. First, a first domain α has a resin width ratio between 1 and 5. In this domain, the stress ratio suddenly decreases with an increase of the resin width ratio, showing a near straight line behavior. Next, a second domain β has a resin width ratio between 5 and 19. In this domain, the stress ratio slowly decreases with an increase of the resin width ratio, in comparison with the first domain α, showing a curved shape. Finally, a third domain γ has a resin width ratio between 19 and 35.5. In this domain, decrease of the stress ratio with respect to the change of the resin width ratio slows down remarkably, again showing linearity.

For determination on boundary values of the first domain a to the third domain γ, two extrapolation lines $L_1$ and $L_2$ are drawn as shown in FIG. 3. The first extrapolation line $L_1$ is an extension of a line which connects a stress ratio for the resin width ratio of 1 to a stress ratio immediately before a straight line property disappears after that, toward a higher resin width ratio side. The second extrapolation line $L_2$ is an extension of a line which connects a stress ratio for the resin width ratio of 35.5 to a stress ratio immediately before a straight line property disappears in a low resin width ratio side, toward a lower resin width ratio side. A resin width ratio at which an overlap of the extrapolation line $L_1$ with the stress ratio curve begins to be lost is determined as a boundary value between the first domain α and the second domain β. In addition, a resin width ratio at which the extrapolation line $L_1$ begins to overlap with the stress ratio curve is determined as a boundary value between the second domain β and the third domain γ.

The first domain α is a domain where a difference between stresses applied to the resin widths begins to occur with an increase of the resin width ratio. It is considered that a spring model can be applied as a behavior of the junction member 21 in this domain. In other words, as long as resin width ratios within this domain are employed, the junction member 21 after thermocompression returns to its original shape after the release of weight. Accordingly, the junction member 21 has to be designed within a range of resin width ratios of the first domain α as possible in which the dimension of the junction member 21 is easily maintained.

The second domain β is a domain where an extent of distortion of one side (Wh) having small resin width becomes high and a stress applied to the one side partially reaches a yield stress. Specifically, "partially" used herein refers to a portion such as an end portion of the junction member 21 (for example, a boundary line with the hollow portion 2, corners of the hollow portion 2, etc) to which a high stress is likely to be applied. Accordingly, an instable state where a spring model cannot be partially adapted to the one side having a small resin width is formed. Since integration of values of stresses applied to infinitesimal areas (a numerator of the stress ratio in the figure) ceases linear increase due to the partial yield stress, the stress ratio curve loses its linearity accordingly. In this domain, pattern deformation begins to occur in only a portion of the side with small resin width ratio, which reaches the yield stress. Although such an employment of the resin width ratio has to be avoided, if a design of the junction member 21 in the first domain α is impossible in consideration of the design of the device chip, it is expected that deformation occurs due to the distance between the resin sides, and the photosensitive region is relatively wide, a design in a junction region in the range of the second domain β is also possible.

The third domain γ is a domain where one side having a small resin width receives the yield stress nearly entirely. The numerator ($\sigma_{Wh}$) of the stress ratio receives a nearly constant yield stress, while a denominator ($\sigma_{Wv}$) of the stress ratio undergoes low variation since a side having a large resin width is an elastic region and has a large area. Accordingly, a nearly constant stress ratio ($\sigma_{Wh}/\sigma_{Wv}$) can be obtained in this domain. This domain where the side having a small resin width receives the yield stress fully should not be employed.

In this manner, in the semiconductor package 1, assuming that the minimum width of the junction member 21 is a and its maximum is b, it is preferable that b/a be designed to be in a range of 1 to 19 (that is, a range of the first domain α to second domain β). With this range, it is possible to restrict the change of dimension in the hollow portion 2 after thermocompression of the semiconductor substrate 10 and the protection substrate 20 to be less.

Figure 4:
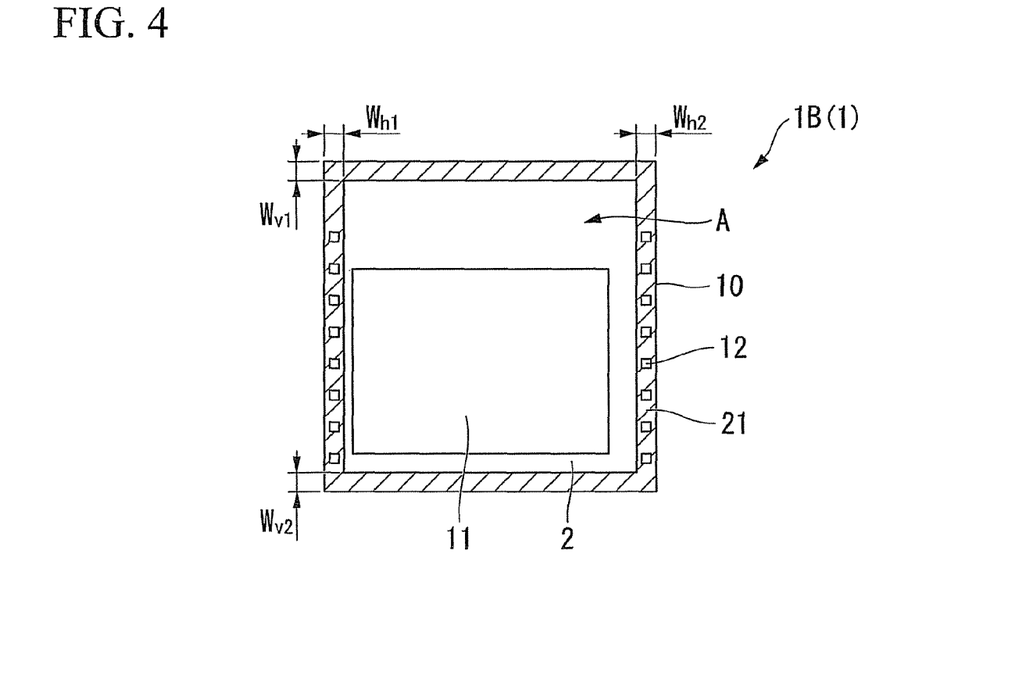
FIG. 4 is a schematic plan view illustrating a semiconductor package according to another exemplary embodiment of the present invention.

FIG. 4 is a schematic plan view illustrating a semiconductor package according to another exemplary embodiment of the present invention. In the semiconductor package 1B (1), the functional element 11 is disposed in a region deviated from the central region of a plane A surrounded by the junction member 21 in one surface of the semiconductor substrate 10. In this manner, even when the functional element 11 is disposed in the region deviated from the central region of the plane A surrounded by the junction member 21 in the one surface of the semiconductor substrate 10, the present invention can be practiced and can obtain the same effect as the above-described effects.

Figure 5:
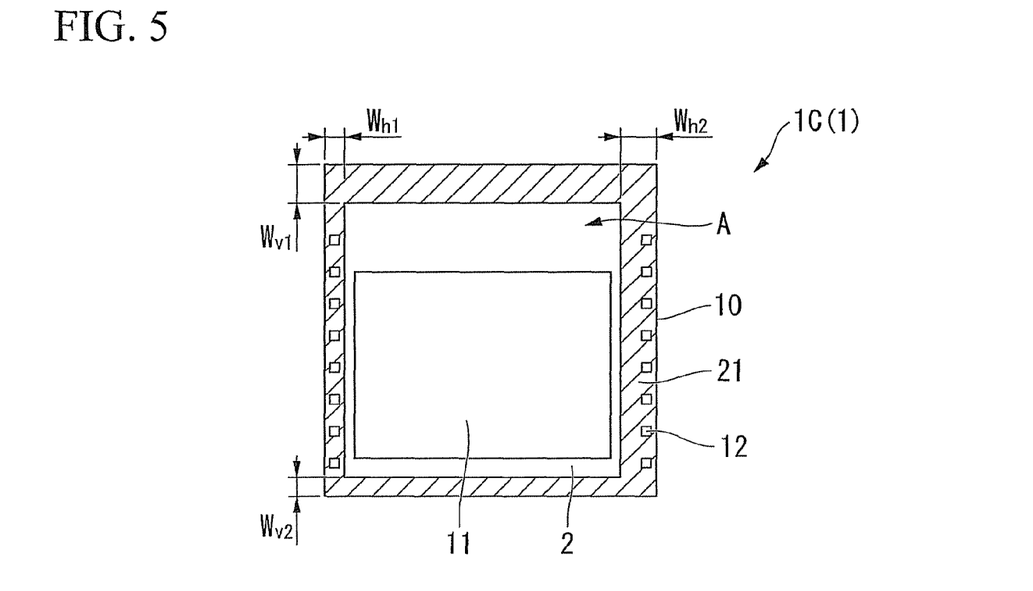
FIG. 5 is a schematic plan view illustrating a semiconductor package according to another exemplary embodiment of the present invention.

FIG. 5 is a schematic plan view illustrating a semiconductor package according to another exemplary embodiment of the present invention.

In the semiconductor package 1C (1), the width of the junction member 21 shown in FIG. 4 is changed. That is, in FIG. 5, the widths of the four sides of the junction member 21 are different, i.e., $Wh_1 \neq Wh_2 \neq Wv_1 \neq Wv_2$. Even in this case, the present invention can be practiced and can obtain the same effect as the above-described effects.

Figure 6:
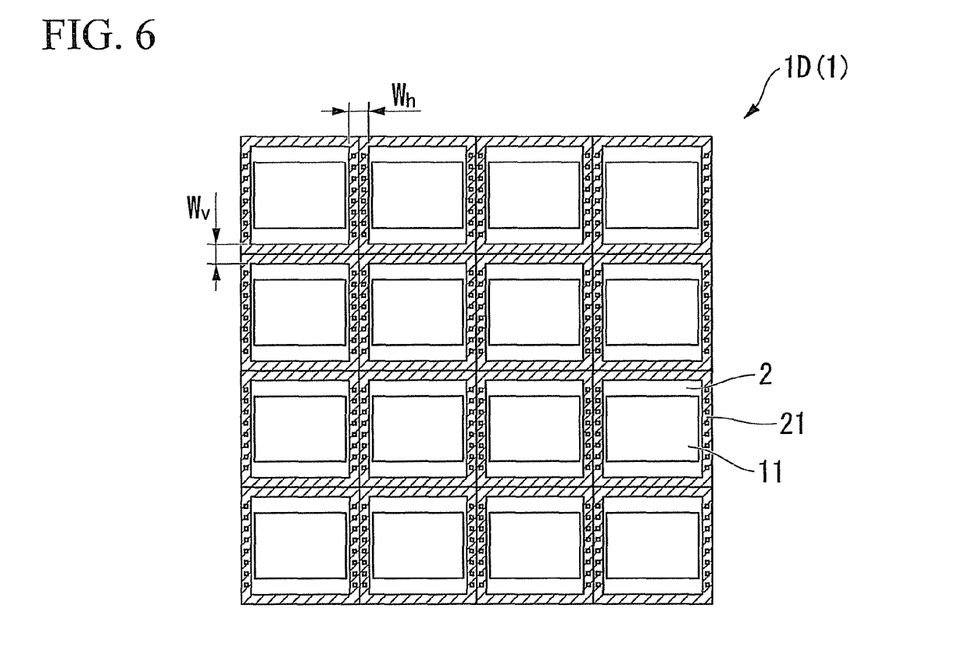
FIG. 6 is a schematic plan view illustrating a semiconductor package according to another exemplary embodiment of the present invention.

FIG. 6 is a schematic plan view showing a semiconductor package according to another exemplary embodiment of the present invention.

In the semiconductor package 1D (1), a plurality of functional elements 11 is disposed in one side of the semiconductor substrate 10 and the junction member 21 is disposed to surround the plurality of functional elements 11. In disposing the plurality of functional elements 11, it is preferable that $Wh=Wh_1+Wh_2=Wv=Wv_1+Wv_2$. In this manner, even when the plurality of functional elements 11 is disposed on the semiconductor substrate 10, the present invention can be applied and can obtain the same effect as the above-described effects.

Figure 7:
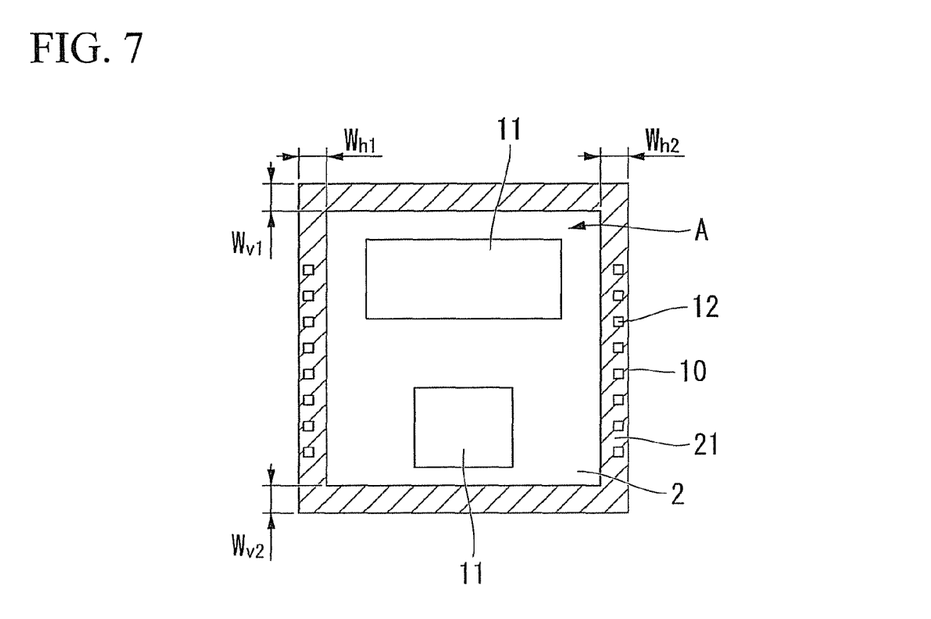
FIG. 7 is a schematic plan view illustrating a semiconductor package according to another exemplary embodiment of the present invention.

FIG. 7 is a schematic plan view illustrating a semiconductor package according to another exemplary embodiment of the present invention. There may exist a plurality of functional elements 11 on a semiconductor chip and dimensions of the functional elements 11 may not be necessarily the same. FIG. 7 shows an example configuration of a semiconductor chip including two functional elements 11 having different dimensions. If there is no need to individually form a hollow structure for the functional elements 11, the package is as shown. That is, all of the functional elements 11 are disposed within one hollow portion. Dimension of four sides of an adhesive region is as described above.

The practice of the present invention can be applied to a configuration where a hollow structure is individually formed for a plurality of functional elements 11. FIG. 8 shows an example where a hollow portion is provided in each functional element 11 for the semiconductor chip shown in FIG. 7. FIG. 8 shows three lines of the above-described adhesive region in the horizontal direction. $Wvi_1$ represents the width of an adhesive line lying between the functional elements 11. As described previously, $Wv_1$ and $Wv_2$ have most preferably the same value, and, as the next best, their ratio is preferably 1 to 5, as the next, 5 to 19. For a width ratio of $Wvi_1$ to $Wv_1$ (=$Wv_2$), it is most preferable that the condition of "$Wvi_1/Wv_1=2.0$" be established in thermocompression at a wafer level.

Figure 9:
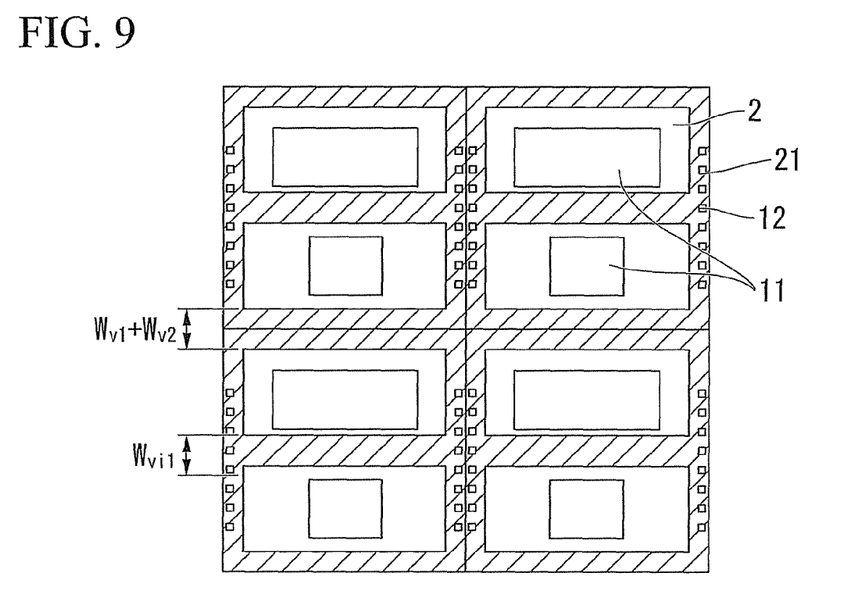
FIG. 9 is a schematic plan view illustrating an (2×2) array of four semiconductor packages of FIG. 8.

Hereinafter, the reason for this will be described with reference to FIG. 9. FIG. 9 is a schematic plan view illustrating a 2×2 array where there are four of the semiconductor package (hereinafter referred to as "chip") shown in FIG. 8. Several tens to several thousands of such semiconductor packages are arrayed on an actual wafer.

On the wafer, a combination of adhesive regions between adjacent semiconductor packages (chips) forms one adhesive line. That is, when it is designed such that the above condition of "$Wvi_1/Wv_1=2.0$" is established, an adhesive width ratio becomes 1 at a wafer level. This is the reason why the relationship of "$Wvi_1/Wv_1=2.0$" is ideal. That is, the condition to show the effects of the present invention is that the adhesive width ratio of $Wvi_1$ to ($Wv_1+Wv_2$) lies between 1 and 5, and as the next best way, 5 to 19.

Moreover, the present invention shows the effects even if a hollow structure is not individually formed for all of the plurality of functional elements 11. For example, it is possible that a hollow structure is formed alone for one of three functional elements 11 while a hollow structure is collectively formed for the two remaining functional elements. Even in this case, it is preferable that the width ratio of the adhesive lines lie between 1 and 19 according to the above condition.

Second Exemplary Embodiment

Next, a method of manufacturing the above-described semiconductor package will be described.

FIGS. 10A to 10E are sectional views illustrating a manufacturing method of the semiconductor device of the present invention in a process order.

The manufacturing method of the semiconductor package according to this exemplary embodiment includes at least a step of disposing a lattice-shaped junction member 21 on a semiconductor substrate 10 having at least one functional element 11 formed thereon, such that the junction member 21 surrounds the functional element 11, a step of bonding the semiconductor substrate 10 and a protection substrate 20 together via the junction member 21, and a step of segmentalizing the semiconductor substrate 10 such that the junction member 21 is disposed in a circumferential region.

In this exemplary embodiment, by disposing the lattice-shaped junction member 21 on the semiconductor substrate 10 having at least one functional element 11 formed thereon, such that the junction member 21 surrounds the functional element 11, and bond the semiconductor substrate 10 and the protection substrate 20 together via the junction member 21, it is possible to reduce in-plane pressure irregularity when the semiconductor substrate 10 is bonded to the protection substrate 20 by thermocompression. In addition, it is possible to suppress junction failure caused by a foam mixture. Thereafter, by segmentalizing the semiconductor substrate 10 such that the junction member 21 is disposed in the circumferential region, it is possible to attain a semiconductor package 1 with compatibility of junction reliability with dimension maintenance.

Hereinafter, each of the above steps will be described in more detail.

(1) First, desired functional elements 11 and electrode pads 12 of an optical device or the like are formed on a surface of the semiconductor substrate 10 made of silicon or the like using a typical semiconductor manufacturing process. In addition, minute holes 14 are formed to penetrate through both front and rear surfaces of the semiconductor substrate 10, and then are filled with a conductor 16 via an insulating film 15 to form a through electrode 13. Additionally, a wiring portion 17 and bumps 18 required for connection are formed (see FIG. 10A).

Figure 10A:
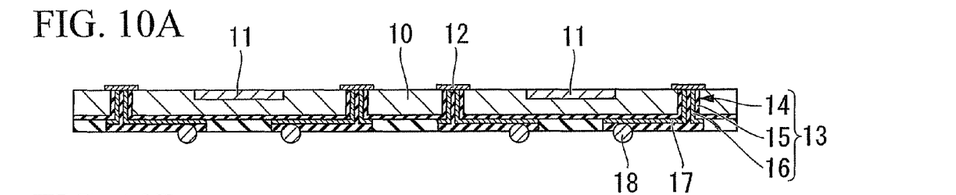
FIG. 10A is a sectional view illustrating an example of a manufacturing method of the semiconductor device shown in FIGS. 1A to 1C in a process order.
Figure 10B:
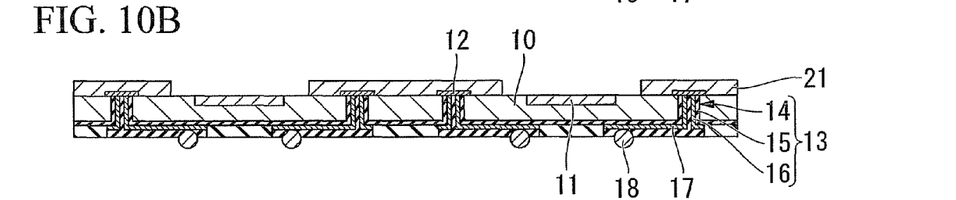
FIG. 10B is a sectional view illustrating an example of the manufacturing method of the same semiconductor device in a process order.

(2) Next, the lattice-shaped junction member 21 is disposed on the semiconductor substrate 10 on which the functional elements 11 and so on are formed, such that the junction member 21 surrounds the functional elements 11 (see FIG. 10B).

The junction member 21 is formed using a spin coat method, a print method, a dispense method or the like which is appropriate for a selected resin material. Subsequently, the junction member 21 is patterned.

In the case of using the spin coat method, a resist layer is patterned beforehand on the protection substrate 20, a lift-off method to peel off the resist layer after formation of the junction member 21 is performed or a masking process using a photomask or the like after formation of the junction member 21 is performed, and thereafter, an etching process for the junction member 21 and a removing process for the mask layer are required to be performed.

At this time, assuming that the minimum width of the junction member 21 is a and its maximum is b, it is preferable that b/a be in a range of 1 to 19. This allows change of dimension after thermocompression to be suppressed to be less.

Figure 10C:
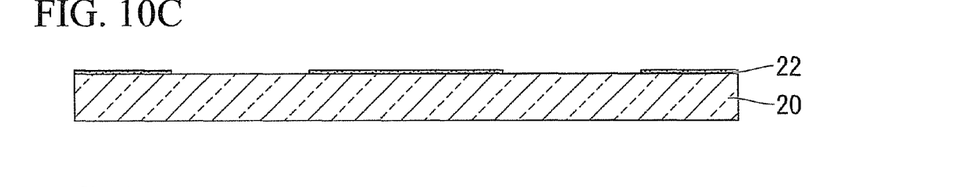
FIG. 10C is a sectional view illustrating an example of the manufacturing method of the same semiconductor device in a process order.

(3) Next, an adhesive layer 22 is formed on the protection substrate 20 (see FIG. 10C).

Subsequently, the adhesive layer 22 formed on the protection substrate 20 is formed and patterned. At this time, since the adhesive has photosensitivity, a patterning by photolithography is possible. A forming method of the adhesive layer 22, a wavelength of a light source for exposure and the type of developer may be selected according to conditions appropriate for a selected adhesive material.

Figure 10D:
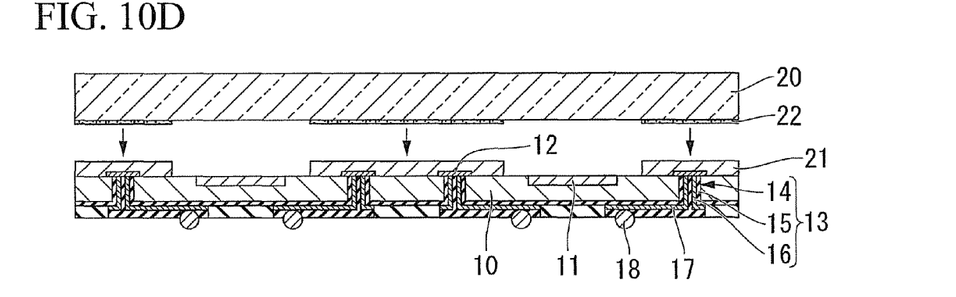
FIG. 10D is a sectional view illustrating an example of the manufacturing method of the same semiconductor device in a process order.

(4) Next, the protection substrate 20 is bonded to the semiconductor substrate 10 via the junction member 21 (see FIG. 10D).

The semiconductor substrate 10 on which the junction member 21 is disposed is aligned with the protection substrate 20 on which the adhesive layer 22 is formed, with the junction member 21 and the adhesive layer 22 facing each other.

Thereafter, the semiconductor substrate 10 is bonded to the protection substrate 20 with the adhesive layer 22 interposed therebetween. The bonding by adhesive requires a source of reaction for adhesive curing, such as heat, ultraviolet or the like. In addition, exhibition of adhesion by the adhesive also requires a proper weighting application, and for that reason, thermocompression using a press plate is typically used.

Figure 10E:
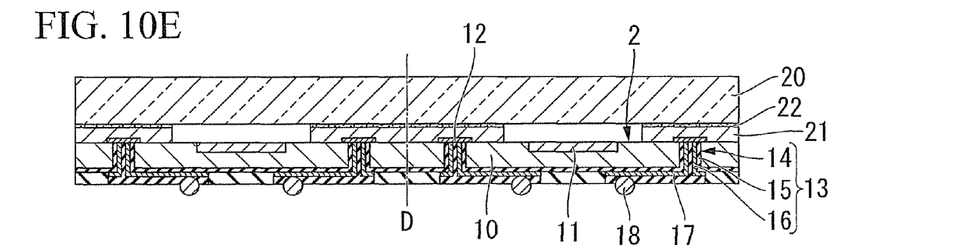
FIG. 10E is a sectional view illustrating an example of the manufacturing method of the same semiconductor device in a process order.

(5) Finally, the semiconductor substrate 10 is segmentalized such that the junction member 21 is disposed in the circumferential region (see FIG. 10E). By cutting each chip at a dicing line D, the semiconductor package 1 as shown in FIGS. 1A to 1C can be obtained.

In addition, although it has been illustrated in the above that the adhesive layer 22 is disposed, the adhesive layer 22 may be omitted by providing the junction member 21 with a function as the adhesive layer 22.

The semiconductor package 1 obtained as above has the functional elements 11 which have a shape different from that of the plane A surrounded by the junction member 21 in the one surface of the semiconductor substrate 10, or which are disposed in a region deviated from the central region of the plane A surrounded by the junction member 21 in the one surface of the semiconductor substrate 10. With this configuration, in the semiconductor package 1, it is possible to reduce in-plane pressure irregularity when the semiconductor substrate 10 is bonded to the protection substrate 20 by thermocompression. In addition, it is possible to suppress junction failure caused by a foam mixture. As a result, it is possible to attain a semiconductor package 1 with compatibility of package junction reliability with package dimension maintenance.

Although the semiconductor package of the present invention and the method of manufacturing the same have been described in the above, the present invention is not limited thereto but various proper modifications may be made without departing from the scope of the present invention.

For example, the present invention can be widely applied to a MEMS device package requiring a hollow structure in terms of functionality since an operating portion is formed on a surface of the device, such as a pressure sensor, an acceleration sensor, a flow sensor and the like as well as an optical sensor package.

In addition, although it has been assumed in the above-exemplary embodiments that the junction member is made of a resin material, the present invention does not limit the junction member to the resin material. The present invention shows the effects for all materials showing functionality as an adhesive layer by thermocompression. Specifically, the present invention shows the same effects for hollow packages using inorganic junction material such as metal material represented by solder, metal or the like, or ceramic material represented by low-melting point glass or the like.

In addition, as shown in FIG. 10A, after forming functional elements and electrode pads on one surface of the semiconductor substrate and forming wiring portion and bumps on another surface via the through electrode, the semiconductor substrate is bonded with the protection substrate via the junction member. However, after forming functional elements and electrode pads, it may form a through electrode, wiring portion and bumps after bonding the semiconductor substrate and the protection substrate together via the junction member.

While preferred exemplary embodiments of the invention have been described and illustrated above, it should be understood that these are examples of the invention and are not to be considered as limiting. Additions, omissions, substitutions, and other modifications can be made without departing from the scope of the present invention. Accordingly, the invention is not to be considered limited by the foregoing description, and is only limited by the scope of the appended claims.

INDUSTRIAL APPLICABILITY

According to an aspect of the semiconductor package, the functional element has a shape different from that of a plane surrounded by a junction member in one surface of the semiconductor substrate, or is disposed in a region deviated from the central region of the plane surrounded by the junction member in that surface of the semiconductor substrate. As a result, pressure irregularity in a plane when the semiconductor substrate and the protection substrate are bonded together by thermocompression can be reduced. In addition, junction failure caused by a foam mixture can be suppressed. Thus, the semiconductor package can have compatibility of junction reliability with package dimension.

According to the method of manufacturing an aspect of the semiconductor package, by disposing the lattice-shaped junction member on the semiconductor substrate having at least one functional element formed thereon, such that the junction member surrounds the functional element, and bonding the semiconductor substrate and the protection substrate together via the junction member. As a result, it is possible to reduce in-plane pressure irregularity when the semiconductor substrate is bonded to the protection substrate by thermocompression. In addition, it is possible to suppress junction failure caused by a foam mixture. Thereafter, by segmentalizing the semiconductor substrate such that the junction member is disposed in the circumferential region, it is possible to easily attain a semiconductor package with compatibility of junction reliability with dimension maintenance.

The invention claimed is:

1. A semiconductor package comprising:
a semiconductor substrate;
a functional element disposed on one surface of the semiconductor substrate;
a lattice-shaped junction member disposed on the one surface of the semiconductor substrate, the lattice-shaped junction member having an internal circumference defining a hollow portion surrounding the functional element, and the lattice-shaped junction member being made of a resin material;
a protection substrate that is disposed on and bonded to the lattice-shaped junction member;
an electrode pad formed on the one surface of the semiconductor substrate; and
a through electrode electrically interconnecting an other surface of the semiconductor substrate with the electrode pad;
wherein the lattice-shaped junction member is disposed between the semiconductor substrate and the protection substrate such that the internal circumference of the lattice-shaped junction member defines the hollow portion between the semiconductor substrate and the protection substrate;
wherein the area defined by the internal circumference of the lattice-shaped junction member has a shape different from a shape of an outer circumference of the functional element, or the area defined by the internal circumference of the lattice-shaped junction member has a symmetric center which is offset from a symmetric center of the functional element;
wherein the lattice-shaped junction member physically covers a surface of the electrode pad; and
wherein disposing the lattice-shaped junction member on the semiconductor substrate comprises disposing the lattice-shaped junction member so that a is a minimum width of the junction member and b is a maximum width of the junction member, and b/a is in a range of 1 to 5.

2. The semiconductor package according to claim 1, wherein an outer circumference of the junction member is substantially coplanar with at least one outer circumferential side of the protection substrate or at least one outer circumferential side of the semiconductor substrate.

3. A semiconductor package comprising:
a semiconductor substrate;
a plurality of functional elements disposed on one surface of the semiconductor substrate;
a lattice-shaped junction member disposed on the one surface of the semiconductor substrate, the lattice-shaped junction member having an internal circumference defining a hollow portion surrounding the plurality of functional elements, and the lattice-shaped junction member being made of a resin material;
a protection substrate disposed on and bonded to the lattice-shaped junction member;
an electrode pad formed on the one surface of the semiconductor substrate; and
a through electrode electrically interconnecting an other surface of the semiconductor substrate with the electrode pad;
wherein the lattice-shaped junction member is disposed between the semiconductor substrate and the protection substrate such that the internal circumference of the lattice-shaped junction member defines the hollow portion between the semiconductor substrate and the protection substrate;
wherein the lattice-shaped junction member physically covers a surface of the electrode pad; and
wherein disposing the lattice-shaped junction member on the semiconductor substrate comprises disposing the lattice-shaped junction member so that a is a minimum width of the junction member, and b is a maximum width of the junction member, and b/a is in a range of 1 to 5.

4. The semiconductor package according to claim 3, wherein an outer circumference of the junction member is substantially coplanar with at least one outer circumferential side of the protection substrate or at least one outer circumferential side of the semiconductor substrate.

5. A semiconductor package comprising:
a semiconductor substrate;
a plurality of functional elements disposed on one surface of the semiconductor substrate;
a lattice-shaped junction member disposed on the one surface of the semiconductor substrate, the lattice-shaped junction member having a plurality of internal circumferences defining a plurality of hollow portions, such that each of the plurality of functional elements is surrounded by one of the plurality of hollow portions, and the lattice-shaped junction member being made of a resin material;
a protection substrate disposed on and bonded to the lattice-shaped junction member;
an electrode pad formed on the one surface of the semiconductor substrate; and
a through electrode electrically interconnecting an other surface of the semiconductor with the electrode pad;
wherein the lattice-shaped junction member is disposed between the semiconductor substrate and the protection substrate such that the internal circumferences of the lattice-shaped junction member define the hollow portions between the semiconductor substrate and the protection substrate; and
wherein an area defined by at least one of the internal circumferences of the lattice-shaped junction member has a shape different from a shape of an outer circumference of the functional element disposed therein, or the area defined by the at least one internal circumference of the lattice-shaped junction member has a symmetric center which is offset from a symmetric center of the functional element disposed therein;

wherein the lattice-shaped junction member physically covers a surface of the electrode pad; and wherein disposing the lattice-shaped junction member on the semiconductor substrate comprises disposing the lattice-shaped junction member so that a is a minimum width of the junction member, and b is a maximum width of the junction member, and b/a is in a range of 1 to 5.

6. A method of manufacturing a semiconductor package, the method comprising:

disposing a lattice-shaped junction member on one surface of a semiconductor substrate, the semiconductor substrate having at least one functional element formed thereon, such that the lattice-shaped junction member surrounds the at least one functional element and covers a surface of the electrode pad connecting a through electrode, and the lattice-shaped junction member being made of a resin material;

bonding the semiconductor substrate and a protection substrate together via the lattice-shaped shaped junction member; and segmenting the combined semiconductor substrate, the lattice-shaped junction member, and the protection substrate, such that the lattice-shaped junction member is disposed in a circumferential region;

wherein the junction member comprises at least one inner circumference defining a hollow portion which surrounds the at least one functional element, and the through electrode electrically interconnecting an other surface of the semiconductor substrate with the electrode pad, wherein disposing the lattice-shaped junction member on the semiconductor substrate comprises disposing the lattice-shaped junction member such that an area of the hollow portion has a shape different from a shape of and outer circumference of the at least one functional element or the area of the hollow portion has a symmetric center offset from a symmetric center of the at least one functional element; and wherein disposing the lattice-shaped junction member on the semiconductor substrate comprises disposing the lattice-shaped junction member so that a is a minimum width of the junction member, and b is a maximum width of the junction member, and b/a is in a range of 1 to 5.

* * * * *